(12) United States Patent
Tatemichi et al.

(10) Patent No.: US 9,842,912 B2
(45) Date of Patent: Dec. 12, 2017

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Shuhei Tatemichi, Matsumoto (JP); Shunji Takenoiri, Matsumoto (JP); Masanori Inoue, Ina (JP); Yuji Kumagai, Matsumoto (JP); Satoshi Kuboyama, Ibaraki (JP); Eiichi Mizuta, Ibaraki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/178,574

(22) Filed: Jun. 10, 2016

(65) Prior Publication Data
US 2017/0054000 A1 Feb. 23, 2017

(30) Foreign Application Priority Data

Aug. 19, 2015 (JP) ................................. 2015-162144
Dec. 4, 2015 (JP) ................................. 2015-237860

(51) Int. Cl.
*H01L 29/68* (2006.01)
*H01L 29/66* (2006.01)
(Continued)

(52) U.S. Cl.
CPC ...... *H01L 29/66712* (2013.01); *H01L 23/552* (2013.01); *H01L 23/556* (2013.01);
(Continued)

(58) Field of Classification Search
CPC .......... H01L 29/1095; H01L 29/42376; H01L 29/4238; H01L 29/66712–29/66734; H01L 29/7802–29/7815
See application file for complete search history.

(56) References Cited

U.S. PATENT DOCUMENTS

| 7,791,147 B2 | 9/2010 | Cascio et al. |
| 2011/0241644 A1* | 10/2011 | Hashimoto ......... H01L 29/0869 323/299 |
| 2014/0124851 A1 | 5/2014 | Gamerith et al. |

FOREIGN PATENT DOCUMENTS

| JP | 56-116669 A | 9/1981 |
| JP | 60-38877 A | 2/1985 |

(Continued)

*Primary Examiner* — Daniel Shook

(57) ABSTRACT

A semiconductor device with a high radiation tolerance is provided. A semiconductor device comprising a semiconductor substrate, a first body region and a second body region provided on a front surface side of the semiconductor substrate, a neck portion provided between the first body region and the second body region, a first source region formed within the first body region and a second source region formed within the second body region, a first gate electrode provided to face the first body region between the first source region and the neck portion, a second gate electrode provided to face the second body region between the second source region and the neck portion, and an insulating film continuously provided between the first gate electrode and the semiconductor substrate, between the second gate electrode and the semiconductor substrate, and on the front surface side of the neck portion, is provided.

15 Claims, 15 Drawing Sheets

(51) Int. Cl.
*H01L 23/552* (2006.01)
*H01L 23/556* (2006.01)
*H01L 29/08* (2006.01)
*H01L 29/417* (2006.01)
*H01L 29/423* (2006.01)
*H01L 29/78* (2006.01)
*H01L 29/10* (2006.01)
*H01L 21/225* (2006.01)

(52) U.S. Cl.
CPC ...... *H01L 29/0865* (2013.01); *H01L 29/0878* (2013.01); *H01L 29/1095* (2013.01); *H01L 29/41775* (2013.01); *H01L 29/4238* (2013.01); *H01L 29/7802* (2013.01); *H01L 21/2253* (2013.01)

(56) References Cited

FOREIGN PATENT DOCUMENTS

| | | | |
|---|---|---|---|
| JP | 60038877 A | * | 2/1985 |
| JP | 01-286367 A | | 11/1989 |
| JP | 06-69507 A | | 3/1994 |
| JP | H6-244428 | | 9/1994 |

* cited by examiner

SEMICONDUCTOR DEVICE AND METHOD OF MANUFACTURING SEMICONDUCTOR DEVICE

The contents of the following Japanese patent applications are incorporated herein by reference:
NO. 2015-162144 filed in JP on Aug. 19, 2015 and
NO. 2015-237860 filed in JP on Dec. 4, 2015.

BACKGROUND

1. Technical Field

The present invention relates to a semiconductor device and a method of manufacturing a semiconductor device.

2. Related Art

When a MOS-type semiconductor device is used in a radiation environment such as in space or in a nuclear power plant, the radiation sometimes exerts an effect on the semiconductor device. TID (Total Ionizing Dose) and SEGR (Single Event Gate Rapture), etc. are known as the effects of which radiation exerts on a semiconductor device. There are the following documents as the relevant prior art documents.

PRIOR ART DOCUMENT

Patent Document

Patent Document 1: Japanese Patent Application Publication No. 06-244428
Patent Document 2: U.S. Pat. No. 7,791,147, Specification
Patent Document 3: U.S. Patent Application Publication No. 2014/0124851, Specification

SUMMARY

It is preferable that radiation tolerances such as SEGR tolerance and TID tolerance are high for a semiconductor device.

The semiconductor device in a first aspect of the present invention comprises a semiconductor substrate of a first conductivity type. The semiconductor device may have a second conductivity type and may have a first body region and a second body region provided on a front surface side of the semiconductor substrate. The semiconductor device may have a neck portion of a first conductivity type provided between the first body region and the second body region. The semiconductor device may have a first source region formed within the first body region and a second source region formed within the second body region. The semiconductor device may have a first gate electrode provided opposite the first body region between the first source region and the neck portion and a second gate electrode provided opposite the second body region between the second source region and the neck portion. The semiconductor device may have insulating films serially provided between the first gate electrode and a semiconductor substrate, between the second gate electrode and the semiconductor substrate, and on the front surface side of the neck portion.

On the front surface of the semiconductor substrate, an end portion of the first body region and an end portion of the first gate electrode may be provided in opposite positions. On the front surface of the semiconductor substrate, the end portion of the second body region and the end portion of the second gate electrode may be provided in opposite positions.

The first body region and the second body region may have a protruding portion which protrudes to the neck portion side beyond the end portion on the front surface of the semiconductor substrate. The length A with which the protruding portion protrudes to the neck portion side beyond the end portion on the front surface of the semiconductor substrate of each body region may be in the range of an equation below.

$$0 < A < \frac{L}{2} - \sqrt{\frac{2K\varepsilon_0}{q} \frac{N_A}{N_D(N_A + N_D)} \phi_{bi}}$$ [Equation 1]

However, L indicates a distance between the first gate electrode and the second gate electrode, K indicates the permittivity of vacuum, $\varepsilon_0$ indicates a relative permittivity of the semiconductor substrate, q indicates the elementary charge, $N_A$ indicates an acceptor concentration of a p-type conductive region of the body region and the neck portion, $N_D$ indicates a donor concentration of an n-type conductive region of the body region and the neck portion, and $\phi_{bi}$ indicates a built-in potential generated in a depletion layer between the body region and the neck portion.

The protruding portion may have a convex-shaped recessed portion on a back surface side of the semiconductor substrate between the front surface of the semiconductor substrate and a tip which is protruding on the side of the neck portion the most. In the recessed portion, a depth in the direction of the depth of the semiconductor substrate and a width in the direction parallel to the front surface of the semiconductor substrate may be equal. A thickness of at least a portion of the insulating film opposite the neck portion may be different from a thickness of the insulating film opposite the first gate electrode and the second gate electrode.

In a second aspect of the present invention, a method of manufacturing a semiconductor device is provided, the method of manufacturing comprising, forming a first body region and a second body region of a second conductivity type, and a neck portion of a first conductivity type provided between the first body region and the second body region, by implanting impurities of a second conductivity type in a front surface side of a semiconductor substrate of a first conductivity type, forming a first source region of a first conductivity type in the first body region and a second source region of a first conductivity type in the second body region, forming an insulating film on a front surface of the semiconductor substrate, forming a first gate electrode opposite the first body region between the first source region and the neck portion, and a second gate electrode opposite the second body region between the second source region and the neck portion, on the front surface side of the insulating film, and forming a protruding portion which protrudes to the neck portion side beyond the end portion on the front surface of the semiconductor substrate, in the first body region and the second body region after forming the first gate electrode and the second gate electrode.

In the forming of the first gate electrode and the second gate electrode, each gate electrode may be formed in the inner side of the body region rather than in the end portion on the front surface of the semiconductor substrate of each body region.

The forming of the protruding portion may have a step of oxidizing which oxidizes the front surface of the semiconductor substrate. In the oxidizing, an insulating film which is not covered by respective gate electrodes may absorb the impurities of a body region which is not covered by respective gate electrodes. In the oxidizing, the insulating film may absorb the impurities of each body region until the end portion of the first body region and the end portion of the first gate electrode are in opposite positions and the end portion of the second body region and the end portion of the second gate electrode are in opposite positions.

In the step of forming the insulating film, the insulating film may be formed by oxidizing the front surface of the semiconductor substrate. An oxidizing temperature in the oxidizing may be lower than an oxidizing temperature in the step of forming the insulating film.

The forming of the protruding portion may have a step of implanting counter impurities in which counter impurities are implanted in the neck portion of the second conductivity type with the first gate electrode and the second gate electrode as a mask. The step of forming the protruding portion may additionally have an annealing step in which the semiconductor substrate is annealed after the counter impurities are implanted.

In the step of forming the first gate electrode and the second gate electrode, a conductive film may be formed on the front surface side of the insulating film, the first gate electrode and the second gate electrode may be formed by patterning the conductive film, and the insulating film of the surface side of the neck portion may be etched in the patterning.

The above-described summary of the invention does not list all of the characteristics of the present invention. Also, a sub-combination of these characteristic groups may also be an invention.

DESCRIPTION OF EXEMPLARY EMBODIMENTS

Hereinafter, the present invention is described through the embodiments of the invention. However, the embodiments below do not limit the scope of claims of the invention. Also, not all of the combinations of the characteristic described in the embodiment are necessarily required in the means to solve the problems of the invention.

Figure 1:
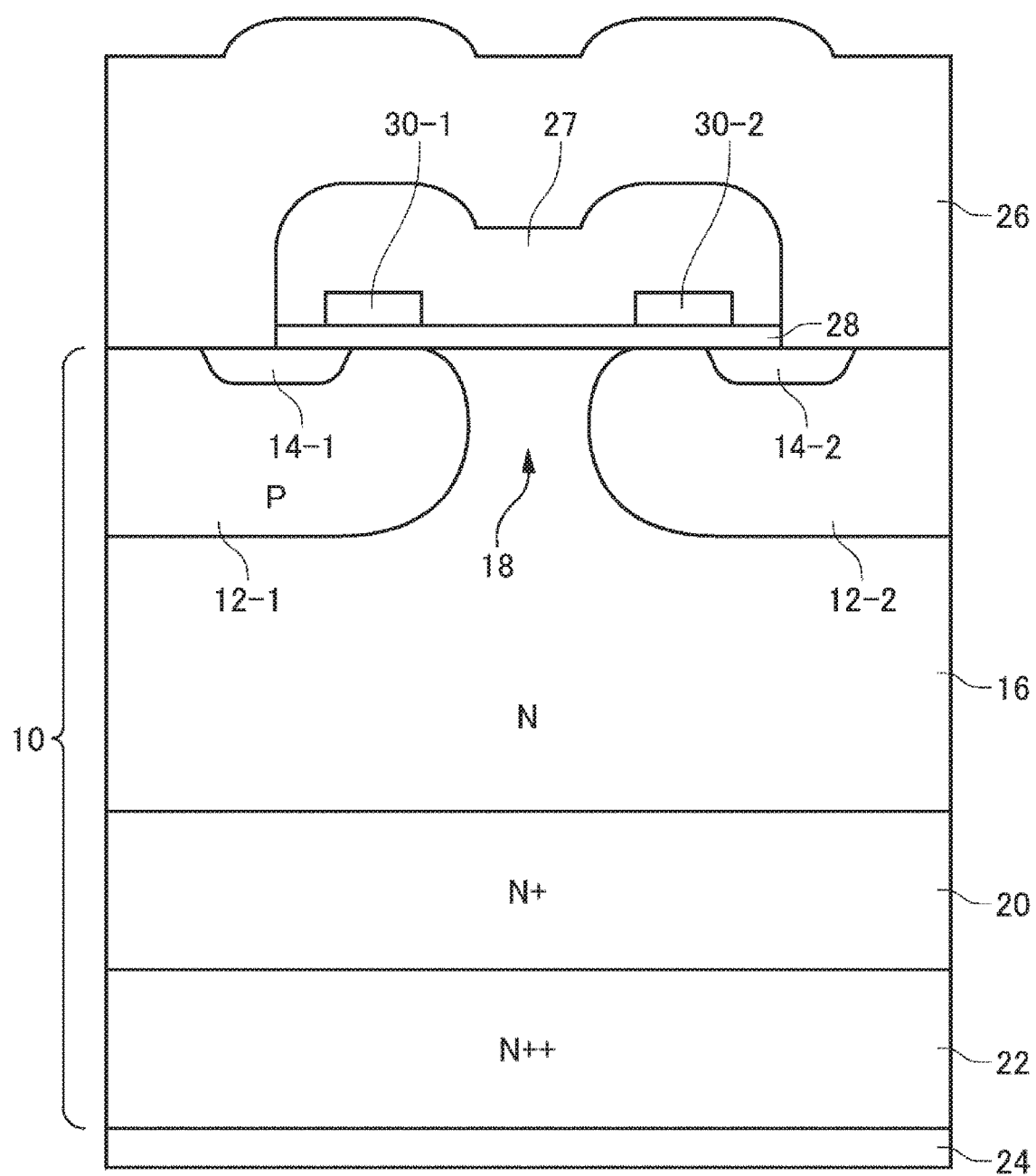
FIG. 1 is a cross-sectional view showing one example of the semiconductor device 100 according to one embodiment of the present invention.

FIG. 1 is a cross-sectional view showing one example of a semiconductor device 100 according to one embodiment of the present invention. The semiconductor device 100 comprises a semiconductor substrate 10, a first gate electrode 30-1, a second gate electrode 30-2, an insulating film 28, an interlayer insulating portion 27, a source electrode 26, and a drain electrode 24.

The semiconductor substrate 10 has a first conductivity type. In the present example, although the first conductivity type is described as n-type and a second conductivity type as p-type, the first conductivity type may be p-type and the second conductivity type may be n-type. The semiconductor substrate 10 is, for example, a silicon substrate to which a predetermined N-type impurity is added.

The semiconductor substrate 10 has a first body region 12-1 and a second body region 12-2 separated from each other on the cross section that is perpendicular to the front surface of the semiconductor substrate 10. In the present example, each body region 12 is of the p-type. Each body region 12 is exposed on the front surface of the semiconductor substrate 10.

A drift region 16 of an n-type is provided in the front surface side of the semiconductor substrate 10. The first body region 12-1 and the second body region 12-2 are formed in a region on the front surface side of the drift region 16. The n-type drift region 16 remains between the first body region 12-1 and the second body region 12-2. In the present specification, the n-type region between the first body region 12-1 and the second body region 12-2 is referred to as a neck portion 18.

A first source region 14-1 is formed within the first body region 12-1. A second source region 14-2 is formed within the second body region 12-2. Each source region 14 is exposed on the front surface of the semiconductor substrate 10. Also, in the region other than the front surface of the semiconductor substrate 10, the source region 14 is covered by the body region 12. In the present example, the source region 14 is of the n-type. An impurity concentration of the source region 14 may be higher than an impurity concentration of the semiconductor substrate 10.

On the front surface of the semiconductor substrate 10, the first body region 12-1 between the first source region 14-1 and the neck portion 18 functions as a channel. The first gate electrode 30-1 is provided opposite the first body region 12-1 which functions as the channel. Also, the second body region 12-2 between the second source region 14-2 and the neck portion 18 also functions as a channel. The second gate electrode 30-2 is provided opposite the second body region 12-2 which functions as the channel. An insulating film 28 is provided between each gate electrode 30 and the semiconductor substrate 10. The first gate electrode 30-1 and the second gate electrode 30-2 may be circularly connected on the front surface side of the semiconductor substrate 10 or may extend in parallel to each other.

By applying a predetermined voltage on each gate electrode 30, an inverted region is formed on a front surface of the body region 12 opposite the gate electrode 30. Thereby, the source region 14 and the neck portion 18 are electrically connected. The drift region 16 continuous with the neck portion 18 is provided on a back surface side of each body region 12. The drift region 16 may have the same impurity concentration as the neck portion 18.

An intermediate region 20 is provided on a back surface side of the drift region 16. The intermediate region 20 of the present example is of the n-type. The intermediate region 20 may have a higher impurity concentration than the drift region 16. A drain region 22 is provided on a back surface side of the intermediate region 20. The drain region 22 of the present example is of the n-type. The drain region 22 may have a higher impurity concentration than the intermediate region 20.

A drain electrode 24 is provided on a back surface side of the drain region 22. Current flows between source electrode 26 and the drain electrode 24 by applying a predetermined voltage in the gate electrode 30 in a state in which a predetermined voltage is applied between the source electrode 26 and the drain electrode 24.

Also, the semiconductor device 100 further comprises an interlayer insulating portion 27 covering the gate electrode 30. The interlayer insulating portion 27 insulates the gate electrode 30 from the source electrode 26. The interlayer insulating portion 27 may be formed by depositing BPSG or PSG, etc. The interlayer insulating portion 27 may be provided in a position opposite the neck portion 18. However, the insulating film 28 is provided between the neck portion 18 and the interlayer insulating portion 27.

The source electrode 26 is connected to the source region 14 and the body region 12 not covered by the interlayer insulating portion 27. The source electrode 26 and the drain electrode 24 may be formed by metal such as aluminum. The gate electrode 30 may be formed by a conductive material such as polysilicon.

The insulating film 28 is continuously provided between the first gate electrode 30-1 and the semiconductor substrate 10, between the second gate electrode 30-2 and the semiconductor substrate 10, and on the surface side of the neck portion 18. Insulation properties of the insulating film 28 are higher than that of the interlayer insulating portion 27. The insulating film 28 is formed by oxidizing the front surface of the semiconductor substrate 10, for example.

If radiation is incident on the insulating film 28, an electron-hole pair is generated inside the insulating film 28. In the insulating film 28, the mobility of the holes is lower than that of the electrons, for example, six or more orders of magnitude lower when the insulating film 28 is a silicon oxide film. A fixed charge is generated if a hole is captured in a defect inside the insulating film 28, between the gate electrode 30 and the semiconductor substrate 10. Also, interface traps are produced by the holes which reach the interface. A threshold value of a MOS transistor varies depending on the fixed charge and the interface traps. A phenomenon such as this is called TID.

In contrast, a defect production inside the insulating film 28 can be inhibited by producing the insulating film 28 by a low temperature process. The insulating film 28 is formed by oxidizing the front surface of the semiconductor substrate 10 at a temperature lower than or equal to 1000 degrees Celsius, for example. The oxidizing temperature may be 900 degrees Celsius or lower. Thereby, the TID tolerance can be increased.

Also, if a heavy ion is incident on the semiconductor substrate 10, a plasma filament (an electron-hole pair) is generated along a path through which a heavy ion has passed. Thereby, if a heavy ion is incident on the neck portion 18, the back surface of the insulating film 28 and the drain electrode 24 are electrically connected via the plasma filament generated in the n-type region. If a gate electrode is provided in a position opposite the neck portion 18, a large drain voltage is applied between the front surface and the back surface of the insulating film 28 opposite the neck portion 18 and the insulating film 28 is broken. A phenomenon such as this is called SEGR.

In order to increase the SEGR tolerance, a thickness of the insulating film 28 may be increased. However, if the thickness of the insulating film 28 functioning as a gate oxide is increased, a charge amount generated when an ionizing radiation is irradiated on the gate oxide increases, and the TID tolerance degrades.

In contrast, the semiconductor device 100 has a split gate structure, and the gate electrode 30 is not provided in the position opposite the neck portion 18. For this reason, an electric field concentration in the insulating film 28 can be lessened even when a heavy ion is incident on the neck portion 18 and the back surface of the insulating film 28 is electrically connected to the drain electrode 24. Thereby, an increase of the TID tolerance and an increase of the SEGR tolerance can both be achieved.

Also, the insulating film 28 extends also on the surface side of the neck portion 18, and thus the neck portion 18 can be prevented from contacting the interlayer insulating portion 27 with relatively low insulation properties. For this reason, the reliability of the semiconductor device 100 can be maintained while increasing the TID tolerance and SEGR tolerance by the split gate structure. The insulating film 28 may cover the entire surface of the neck portion 18. The surface of the neck portion 18 refers to an n-type region sandwiched between or surrounded by the first body region 12-1 and the second body region 12-2 on the front surface of the semiconductor substrate 10. Also, the shape of the body region 12 can be controlled when the semiconductor device 100 is manufactured as described later, due to the insulating film 28 extending also in a position opposite the neck portion 18.

Figure 2:
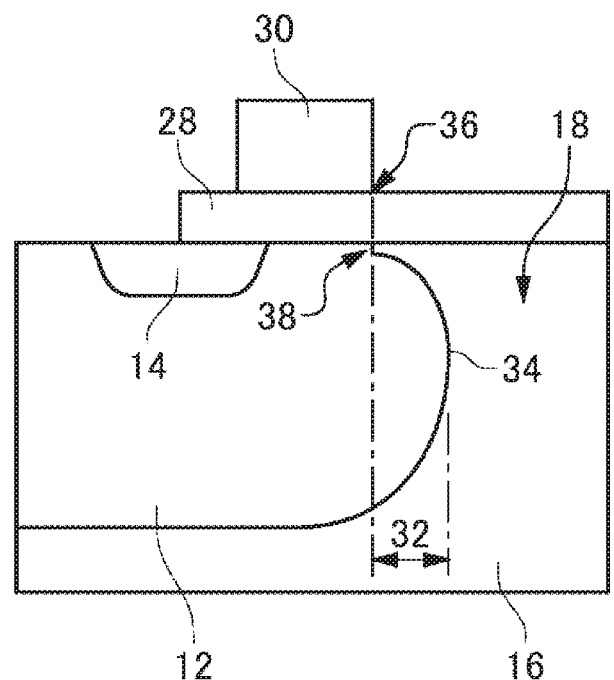
FIG. 2 is a figure showing one example of a shape of a body region 12.

FIG. 2 is a figure showing one example of the shape of the body region 12. Although the shape of the first body region 12-1 is shown in FIG. 2, the second body region 12-2 may have a shape symmetrical with the first body region 12-1.

As shown in FIG. 2, an end portion 38 of the body region 12 and an end portion 36 of the gate electrode 30 are provided in the position to face on the front surface of the semiconductor substrate 10. The end portion 38 of the body region 12 and the end portion 36 of the gate electrode 30 refer to an end portion on the neck portion 18 side. Also, a configuration in which the end portions face means that the position of the end portion 38 and the position of the end portion 36 within a plane which is parallel to the front surface of the semiconductor substrate 10 are almost identical. As one example, when the error of the positions of the end portion 38 and the end portion 36 within the plane is within 0.2 μm, it may be considered that the end portion 38 and the end portion 36 are facing.

However, when the end portions 36 and 38 have positional errors within the above-mentioned range, the end portion 36 of the gate electrode 30 preferably protrudes to the side of the neck portion 18 beyond the end portion 38 of the body region 12. By oppositely arranging the end portion 38 of the body region 12 and the end portion 36 of the gate electrode 30, a controllability of the channel in the body region 12 can be assured and the SEGR tolerance can be maximized.

Also, the body region 12 has a protruding portion 32 which protrudes to the side of the neck portion 18 beyond the end portion 38 on the front surface of the semiconductor substrate 10. The n-type neck portion 18 extends between the protruding portion 32 and the front surface of the semiconductor substrate 10. The protruding portion 32 has a tip 34 inside the semiconductor substrate 10 positioned on the side of the neck portion 18 with respect to the end portion 38 on the front surface of the semiconductor substrate 10. The tip 34 refers to a portion in the protruding portion 32 that is on the side of the neck portion 18 the most in the plane parallel to the front surface of the semiconductor substrate 10.

By providing the protruding portion 32, the insulating film 28 sandwiched between the gate electrodes 30 and opposite the neck portion 18 is protected by the protruding portion 32 when the error of the position between the end portion 36 of the gate electrode 30 and the end portion 38 of the body region 12 is in a range larger than 0 and smaller than 0.2 μm (that is, when the end portion 36 is shifted to the side of the tip 34 with respect to the end portion 38). For this reason, an application of a large drain voltage to the insulating film 28 sandwiched between the gate electrode 30 and the neck portion 18 can be inhibited even if a heavy ion is incident and a plasma filament is formed. Also, the neck portion 18 can be made thin by providing the protruding portion 32. For this reason, when a heavy ion is incident on the semiconductor substrate 10, a path of a plasma filament penetrating the n-type region is not formed easily. Therefore, the SEGR tolerance can be increased.

Figure 3A:
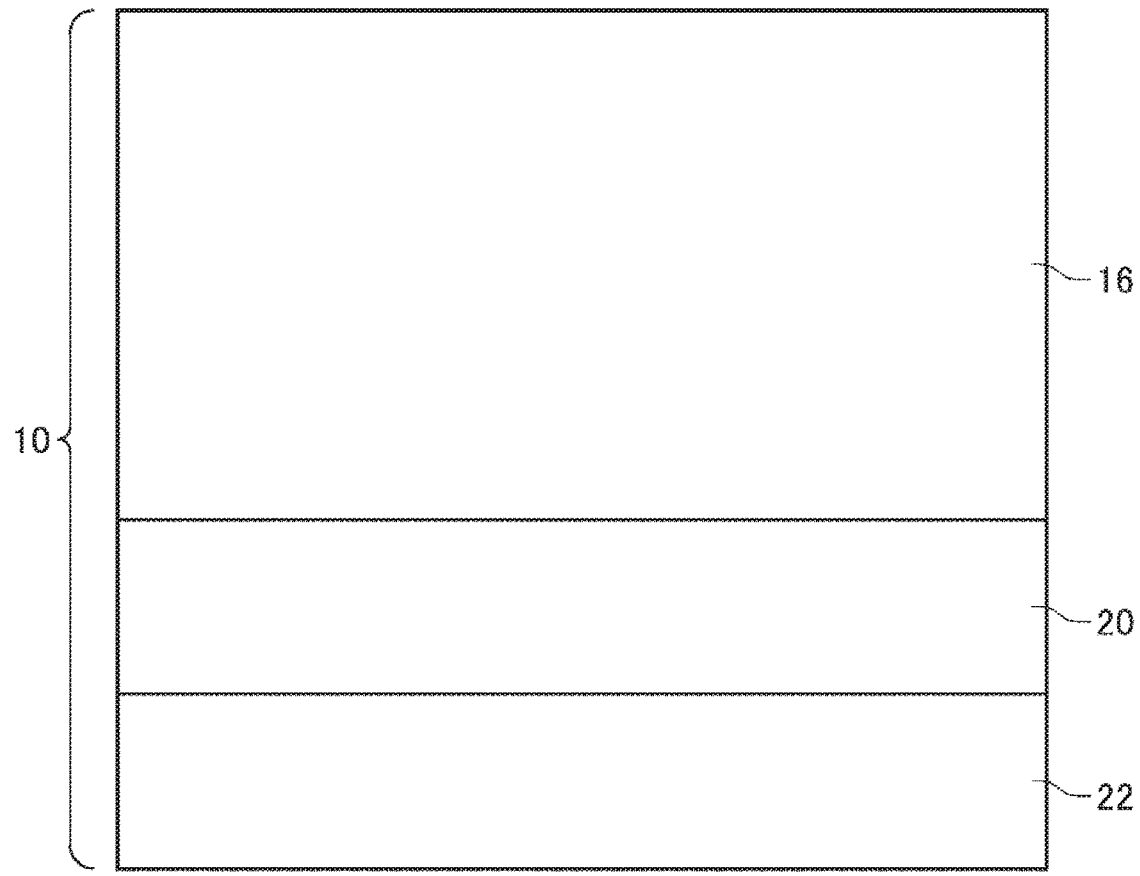
FIG. 3A is a figure showing a step of preparing a substrate.

FIG. 3A through FIG. 3G are figures explaining one example of a method of manufacturing the semiconductor device 100. FIG. 3A shows a step of preparing a substrate. In the step of preparing the substrate, the semiconductor substrate 10 is prepared. The semiconductor substrate 10 of the present example has the drain region 22, the intermediate region 20 and the drift region 16. As one example, an n++-type base substrate is prepared. The semiconductor substrate 10 is prepared by epitaxially growing the n+-type intermediate region 20 and the n-type drift region 16 sequentially on the base substrate. After the n-type drift region 16 is formed, the base substrate may be polished to be of a predetermined thickness.

Figure 3B:
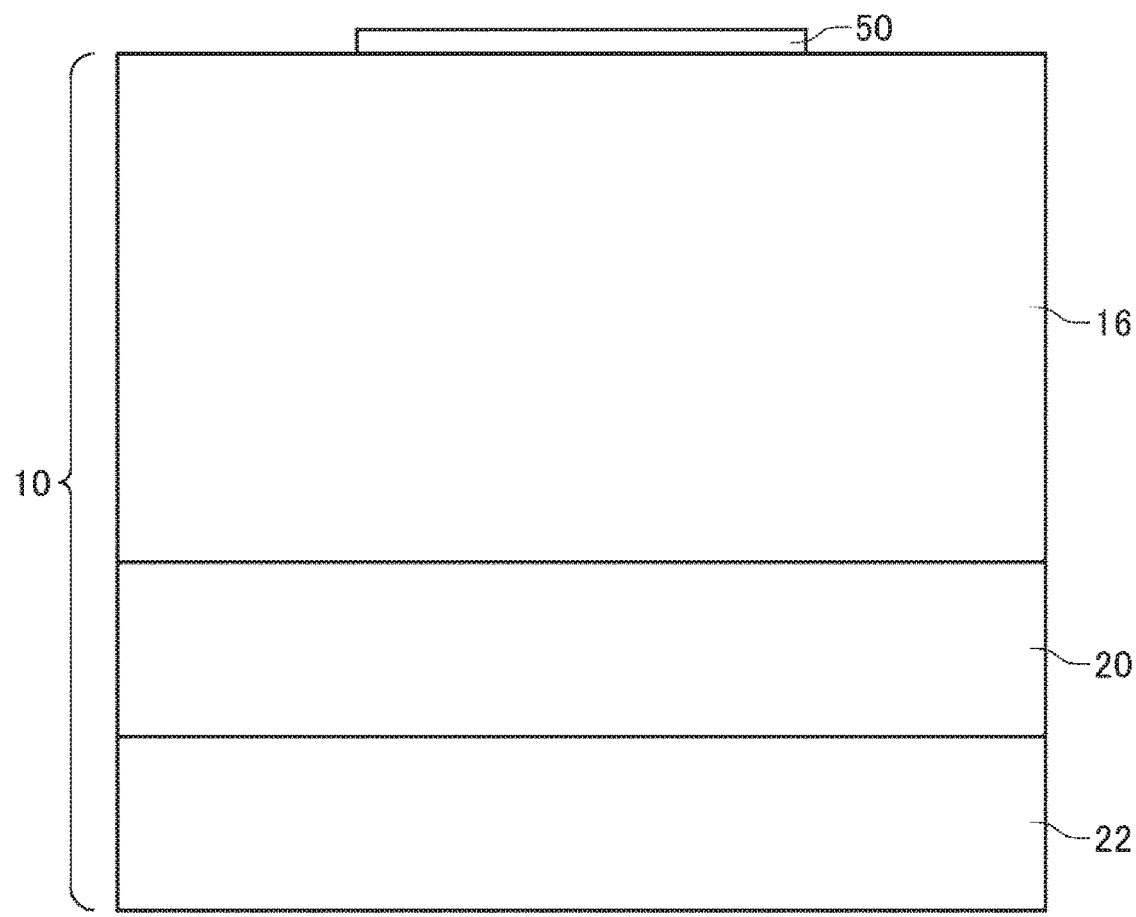
FIG. 3B is a figure showing a step of forming a mask.

FIG. 3B shows a step of forming a mask. In the step of forming a mask, an oxide mask 50 is formed on the front surface of the semiconductor substrate 10. As one example, the oxide mask 50 is formed by patterning an oxide film by plasma etching, etc., after the oxide film is formed by oxidizing the entire surface of the semiconductor substrate 10.

Figure 3C:
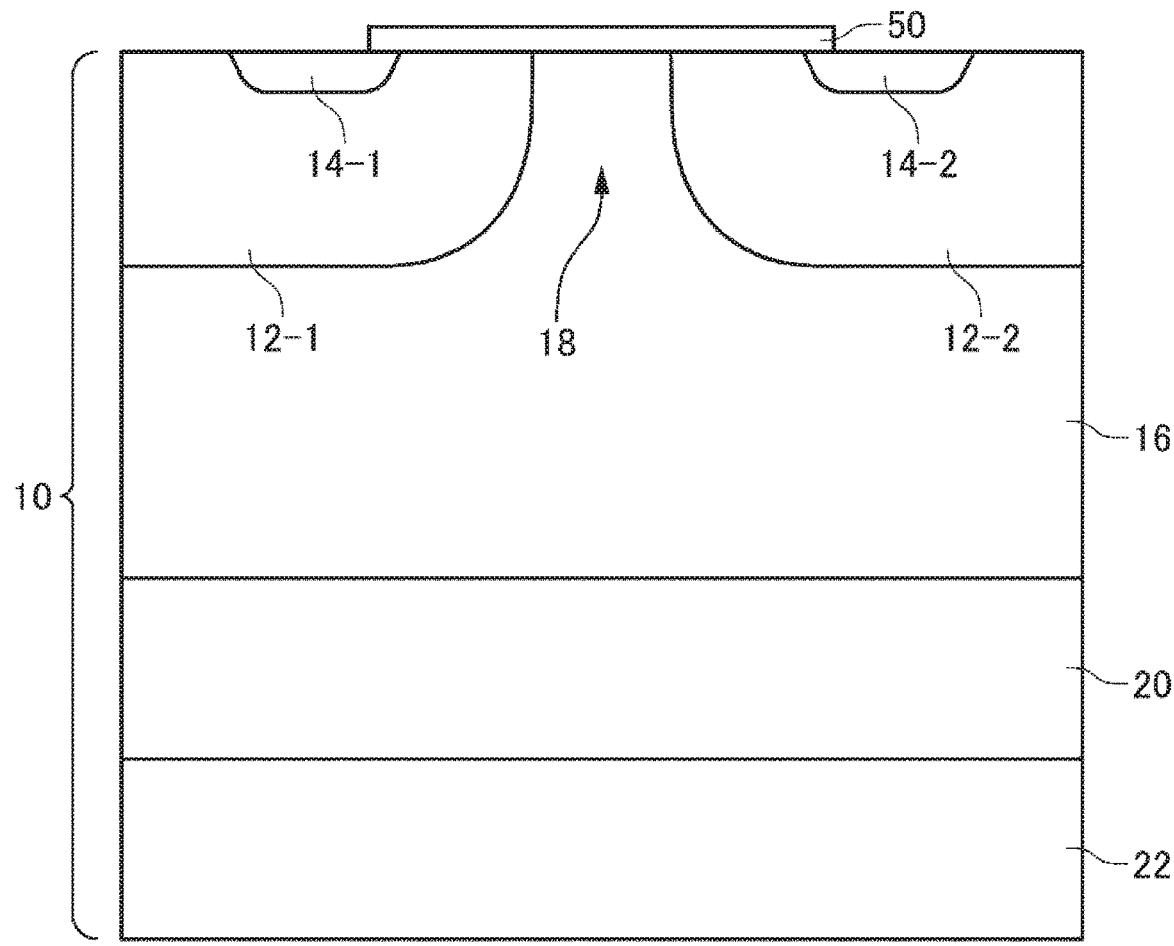
FIG. 3C is a figure showing a step of implanting impurities.

FIG. 3C shows a step of implanting impurities. In the step of implanting impurities, predetermined impurities are implanted from the front surface of the semiconductor substrate 10. As one example, p-type impurities such as boron are implanted at first with the oxide mask 50 as a mask. The p-type impurities are diffused by a step of thermal process, etc., so that the first body region 12-1 and the second body region 12-2 are formed.

In the step of implanting impurities, the body region 12 may be formed along the edge of the oxide mask 50 in a circular manner. The first body region 12-1 and the second body region 12-2 may refer to two regions arranged in the circular body region with the n-type region sandwiched in between. Thereby, the neck portion 18 is also formed. Also, the source region 14 within the body region 12 is formed by using the oxide mask 50 as the mask, and implanting and diffusing the n-type impurities such as arsenic in a partial region of the body region 12. The body region 12 and the source region 14 can be formed in the self-aligned manner by using the oxide mask 50 as the mask. The source region 14 can also be circularly formed like the body region 12. Also, the gate electrode 30 described later can also be circularly formed like the body region 12.

Figure 3D:
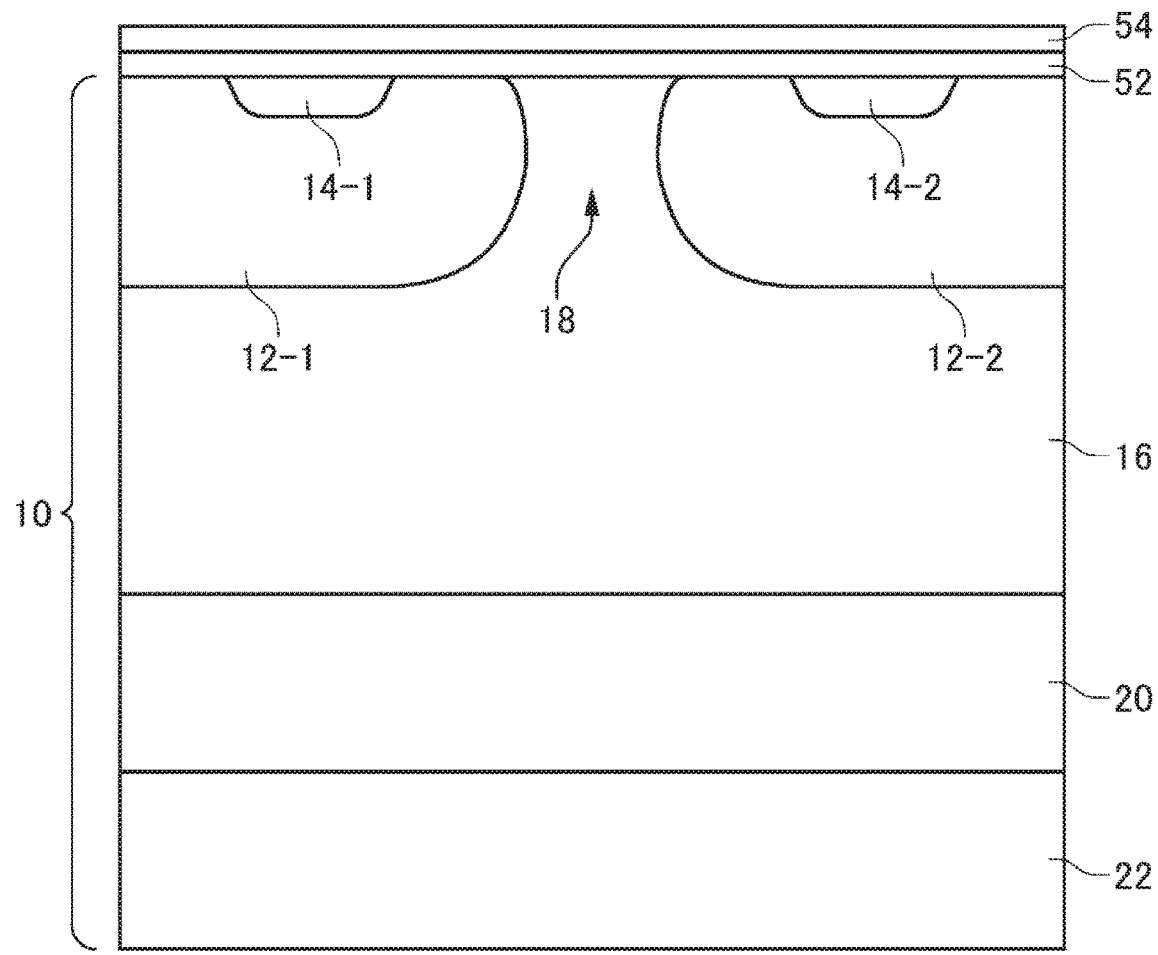
FIG. 3D is a figure showing a step of forming an insulating film.

FIG. 3D shows a step of forming an insulating film. In the step of forming an insulating film, an insulating film 52 is formed by thermally oxidizing the front surface of the semiconductor substrate 10 after the oxide mask 50 shown in FIG. 3C is removed. The insulating film 52 is formed in a low temperature process at a temperature of, for example, 1000 degrees Celsius or lower, for inhibiting a defect generation. A temperature to form the insulating film 52 may be lower than or equal to 900 degrees Celsius. The temperature to form the insulating film 52 in the present example is 900 degrees Celsius. A film thickness of the insulating film 52 is larger than or equal to 300 angstroms and smaller than or equal to 1200 angstroms.

When the insulating film 52 is formed, the impurities included in the body region 12 are absorbed in the insulating film 52. For this reason, the body region 12 has a shape in which the border portion between the neck portion 18 and the body region 12 is involved in the side of the source region 14 near the front surface of the semiconductor substrate 10. In the body region 12, a kind of impurities which is absorbed in the insulating film 52 when oxidizing the semiconductor substrate 10 is implanted.

In the present example, the semiconductor substrate 10 is silicon and the impurity to be implanted in the body region 12 is boron. After the insulating film 52 is formed, a conductive material 54 is deposited on the front surface side of the insulating film 52. The conductive material 54 is, for example, polysilicon. However, the materials of the semiconductor substrate 10, the impurities, and the conductive material 54 are not limited to the above-described examples.

Figure 3E:
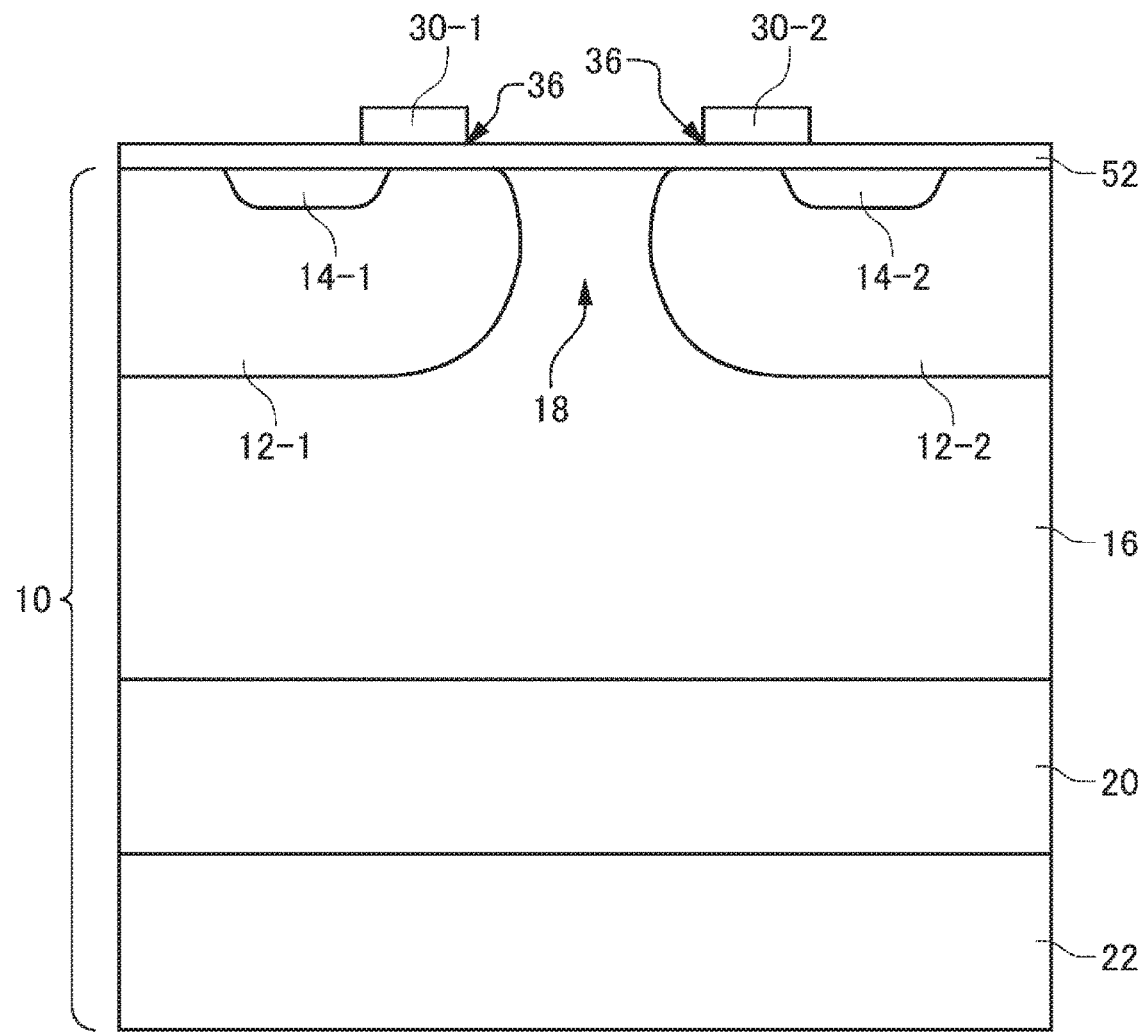
FIG. 3E is a figure showing a step of forming a gate electrode.

FIG. 3E shows a step of forming a gate electrode. In the step of forming a gate electrode, the first gate electrode 30-1 and the second gate electrode 30-2 are formed by etching the conductive material 54. The etching is, for example, plasma etching.

Each gate electrode 30 is formed in a position opposite the body region 12 between the source region 14 and the neck portion 18. However, in the step of forming the gate electrode, the conductive material 54 is etched such that the end portion 36 on the side of the neck portion 18 of each gate electrode 30 is closer to the source region 14 than the end portion on the side of the neck portion 18 of the body region 12 on the front surface of the semiconductor substrate 10.

In this step, the gate electrode 30 is not provided in the position opposite the end portion on the side of the neck portion 18 of the body region 12, on the front surface of the semiconductor substrate 10. That is, the end portion 36 of the gate electrode 30 is arranged on the inner side with respect to the body region 12 within a plane parallel to the front surface of the semiconductor substrate 10.

Figure 3F:
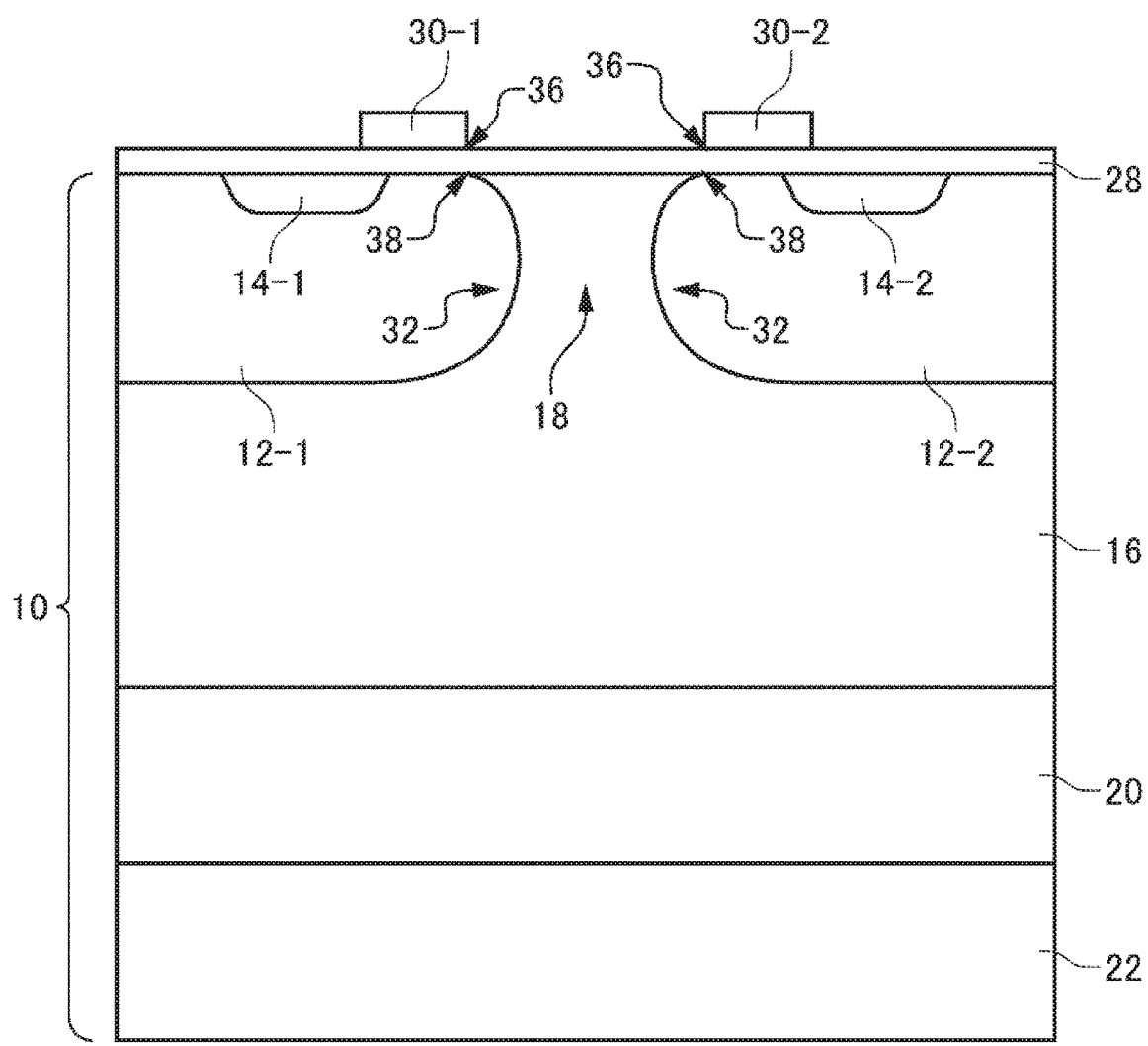
FIG. 3F is a figure showing a step of oxidizing.

FIG. 3F shows a step of forming the protruding portion 32 in the first body region 12-1 and the second body region 12-2 which protrudes to the side of the neck portion 18 beyond the end portion 38 on the front surface of the semiconductor substrate 10. The step of forming the protruding portion 32 of the present example has an oxidizing step. In the oxidizing step, the front surface of the semiconductor substrate 10 is further thermally oxidized after the gate electrode 30 is formed. An oxidizing temperature in the oxidizing step is lower than the oxidizing temperature in the step of forming the insulating film, for example, lower than 900 degrees. The oxidizing temperature in the oxidizing step of the present example is 850 degrees.

By the oxidizing step, the film thickness of the insulating film 52 increases so that the insulating film 28 is formed. However, in the region covered with the gate electrode 30, oxidizing of the semiconductor substrate 10 does not easily proceed, so the film thickness of the insulating film 52 hardly increases. In the region which is not covered with the gate electrode 30, the impurities included in the body region 12 are absorbed by the insulating film 28.

For this reason, the end portion 38 on the front surface of the semiconductor substrate 10 of the body region 12 is involved in the side of the source region 14. That is, the position of the end portion 38 of the body region 12 moves toward the side of the source region 14, as the oxidation of the front surface of the semiconductor substrate 10 proceeds.

In the oxidizing step, the insulating film 28 is made to absorb the impurities of each body region 12 until the end portion 38 of each body region 12 and the end portion 36 of each gate electrode 30 are in opposite positions. However, in the region covered with the gate electrode 30, the impurities included in the body region 12 are hardly absorbed by the insulating film 28. If the end portion 38 of the body region 12 moves to a position opposite the end portion 36 of the gate electrode 30, it does not move onto the side of the source region 14 even if the oxidation further progresses.

For this reason, the position of the end portion 38 of the body region 12 can be aligned in a self-aligned manner relative to the end portion 36 of the gate electrode 30. Also, the position of the end portion 38 of each body region 12 can be precisely adjusted in the same process in the position of the end portion 36 of the gate electrode 30.

Figure 3G:
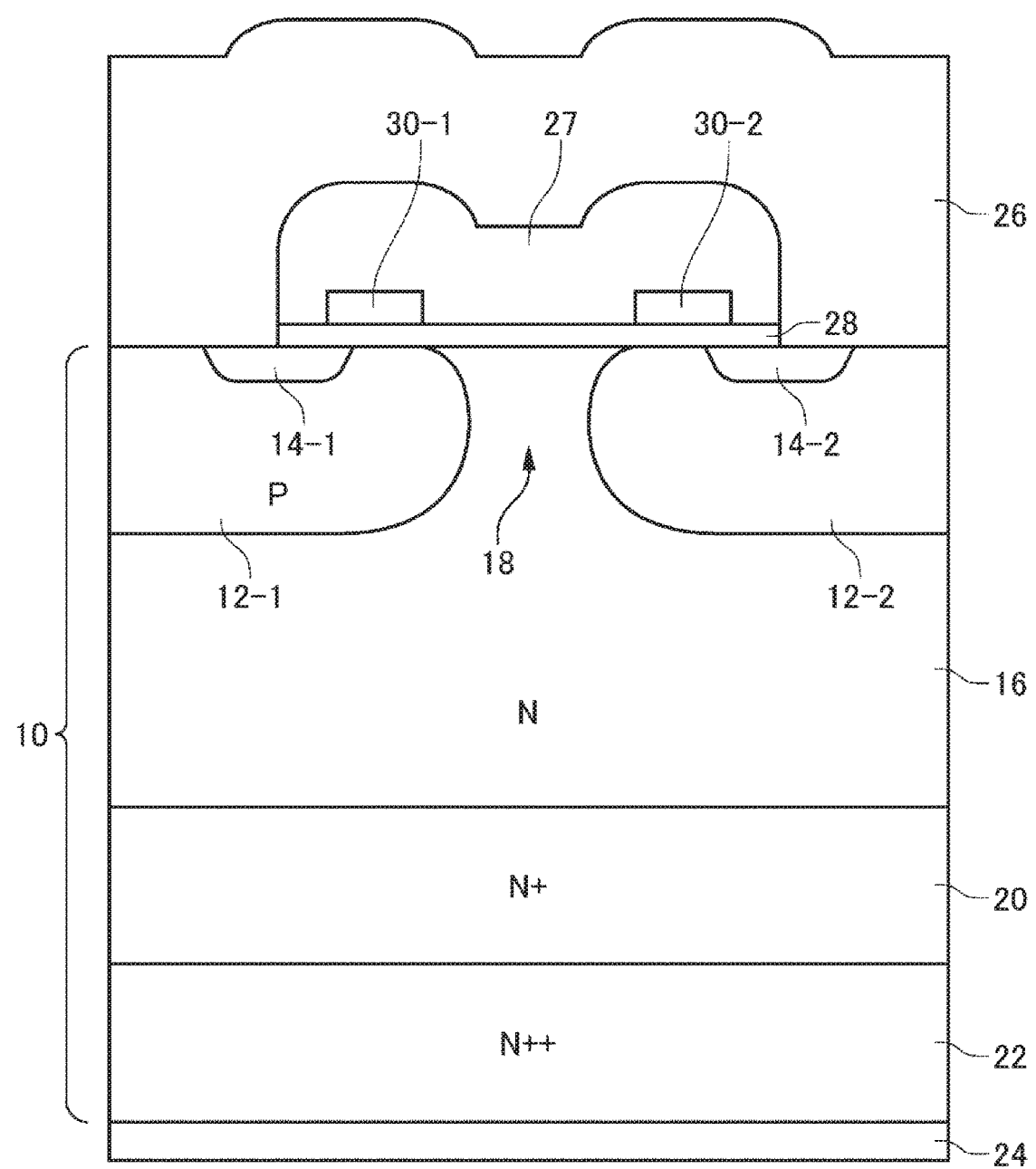
FIG. 3G is a figure showing a step of forming an electrode.

FIG. 3G shows a step of forming electrodes. In the step of forming electrodes, an interlayer insulating portion 27 is formed by forming an insulating film on the front surface side of the semiconductor substrate 10 and etching a predetermined pattern. The interlayer insulating portion 27 is formed, and concurrently, a portion of the source region 14 and a portion of the body region 12 are exposed by etching the insulating film 28. Then, on the front surface side of the semiconductor substrate 10, the source electrode 26 connected to the source region 14 and the body region 12 is formed. Also, the drain electrode 24 is formed on the back surface side of the semiconductor substrate 10. The base substrate can be polish to be of a predetermined thickness before the drain electrode 24 is formed. With a method such as this, the semiconductor device 100 can be manufactured.

According to a method of manufacturing of the present example, not arranging the gate electrode 30 on the neck portion 18 and arranging the gate electrode 30 on the channel of the body region 12 can both be precisely achieved. That is, an increase of the SEGR tolerance and a controllability of the channel can both be obtained. Furthermore, the protruding portion 32 is form in the body region 12, so the SEGR tolerance can be further increased.

Also, the TID tolerance can be increased by forming the insulating film 28 with a low temperature process. Also, it is not required to make the insulating film 28 on the lower side of the gate electrode 30 thick, thus the TID tolerance can be increased. Also, the insulating film 28 is provided on the neck portion 18, so the neck portion 18 can be prevented from contacting the interlayer insulating portion 27 with relatively low insulation properties. Thereby, according to the method of manufacturing or the semiconductor device 100 of the present example, improvements of both the TID tolerance and the SEGR tolerance can be obtained with a high level.

Figure 4:
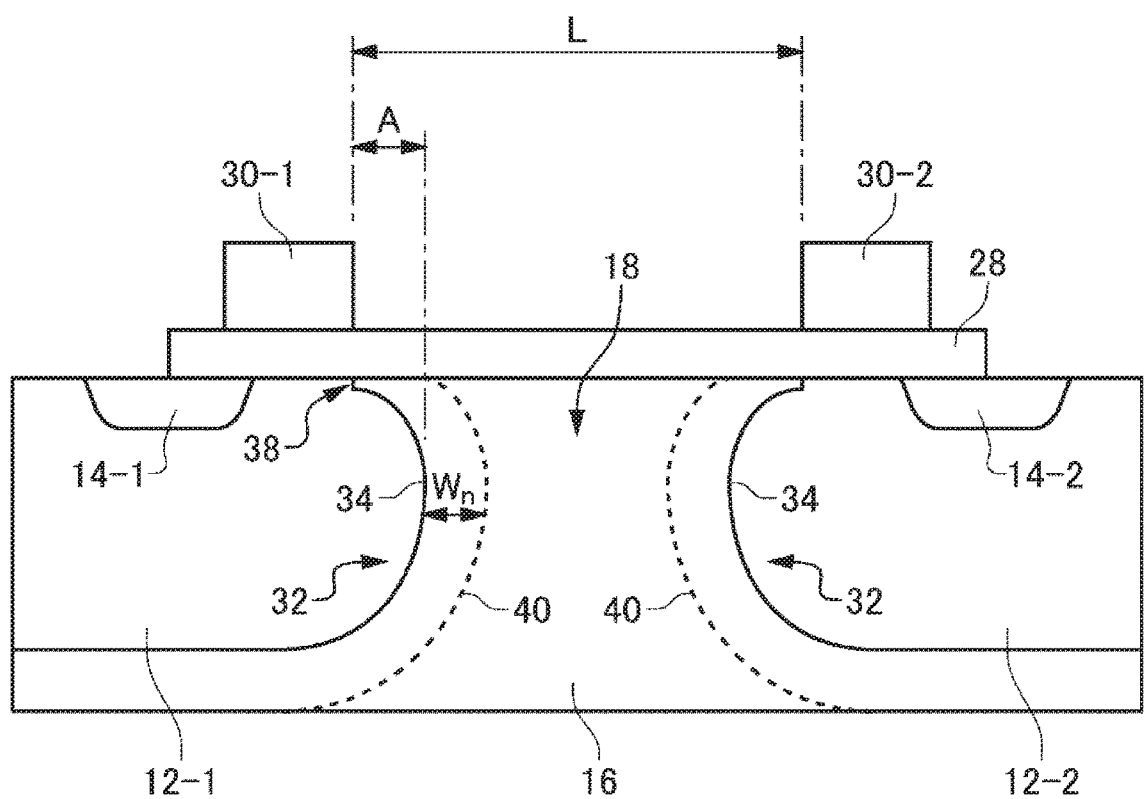
FIG. 4 is a figure explaining a length A of a protruding portion 32.

FIG. 4 is a figure describing a length A of the protruding portion 32. The length A refers to a distance between the end portion 38 of the body region 12 and the tip 34 of the protruding portion 32 within the plane parallel to the front surface of the semiconductor substrate 10. The length A is preferably in a range described below.

$$0 < A < \frac{L}{2} - \sqrt{\frac{2K\varepsilon_0}{q} \frac{N_A}{N_D(N_A + N_D)} \phi_{bi}}$$ [Equation 1]

However, L indicates a distance between the first gate electrode 30-1 and the second gate electrode 30-2, K indicates the permittivity of vacuum, $\varepsilon_0$ indicates the relative permittivity of the semiconductor substrate 10, q indicates the elementary charge, $N_A$ indicates an acceptor concentration of the p-type conductive region of the body region 12 and the neck portion 18, $N_D$ indicates a donor concentration of the n-type conductive region of the body region 12 and the neck portion 18, and $\phi_{bi}$ indicates a built-in potential generated in a depletion layer between the body region 12 and the neck portion 18.

If a depletion layer 40 spreading from the first body region 12-1 to the neck portion 18 and a depletion layer 40 spreading from the second body region 12-2 to the neck portion 18 make contact, a current path disappears and an on resistance increases. For this reason, the length A of the protruding portion 32 is preferably in a range in which the depletion layer 40 from the first body region 12-1 and the depletion layer 40 from the second body region 12-2 do not make contact.

That is, assuming that a width of the depletion layer 40 on the side of the neck portion 18 is $W_n$, an equation below is preferably satisfied.

$$0 < A < \frac{L}{2} - W_n$$ [Equation 2]

When the neck portion 18 is n-type, the width $W_n$ of the depletion layer on the side of the neck portion 18 is given by the following equation.

$$W_n = \sqrt{\frac{2K\varepsilon_0}{q} \frac{N_A}{N_D(N_A + N_D)} \phi_{bi}}$$ [Equation 3]

Equation 1 is obtained from Equation 2 and Equation 3. The upper limit of the length A may be a half of the right side of Equation 1 in order to provide a predetermined distance between the depletion layers.

Also, the length of the protruding portion 32 may be 0.3 µm or greater and 0.5 µm or less. The distance L between the gate electrodes 30 may be 2 µm or greater and 4 µm or less. Also, a distance between the tips 34 of the body region 12 may be 1 µm or greater and 3 µm or less.

Figure 5:
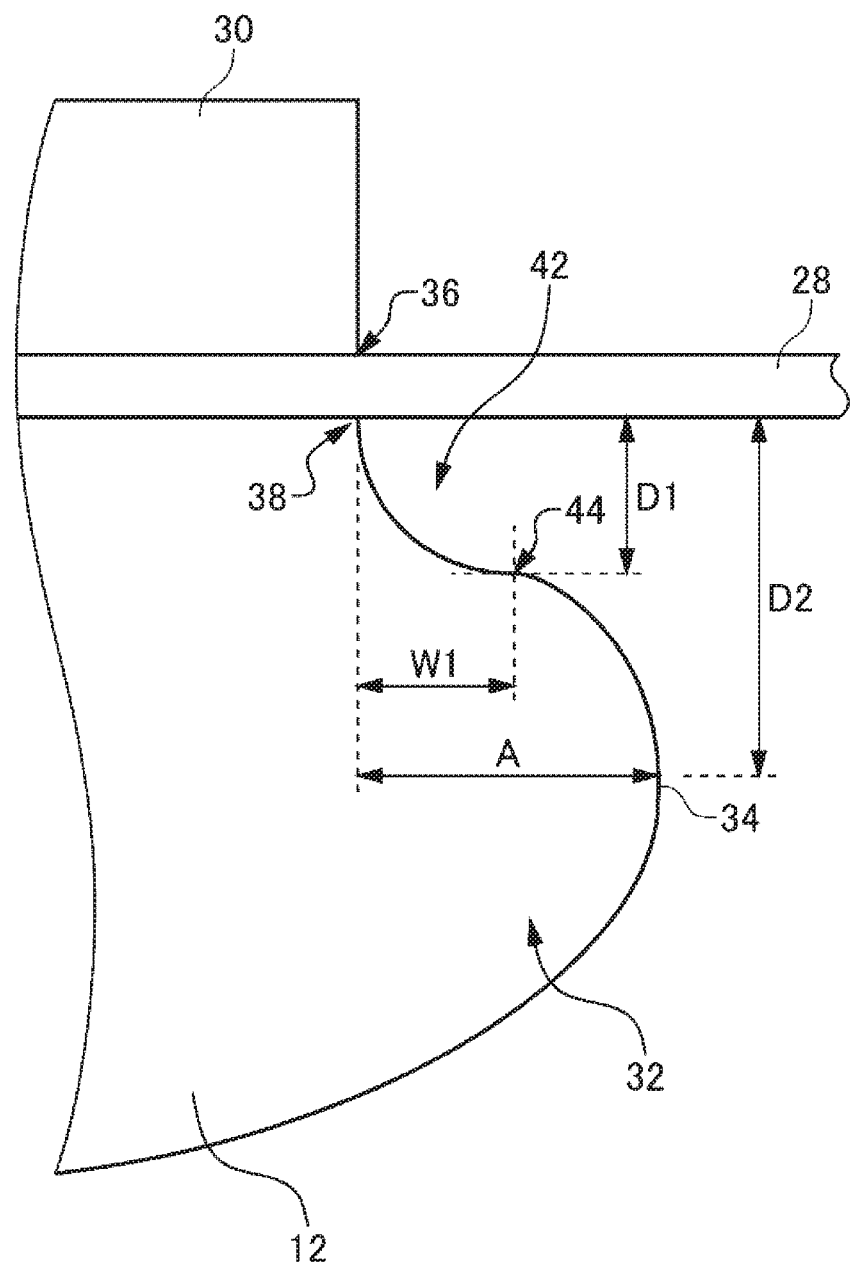
FIG. 5 is a figure showing one example of a shape of the protruding portion 32.

FIG. 5 is a figure showing one example of the shape of the protruding portion 32. The protruding portion 32 of the present example has a recessed portion 42 to be a convex shape on the back surface side of the semiconductor substrate 10 between the end portion 38 on the front surface of the semiconductor substrate 10 and the tip 34. The recessed portion 42 in the present example may be a region in which the tilt of a tangential line of the protruding portion 32 relative to the front surface of the semiconductor substrate 10 gradually reduces toward the tip 34 from the side of the end portion 38, in a cross section which is perpendicular to the front surface of the semiconductor substrate 10. However, the recessed portion 42 may include a portion in which the tangential line of the protruding portion 32 is almost parallel to the front surface of the semiconductor substrate 10 and the tilt does not change.

Since the protruding portion 32 has the recessed portion 42, a current path between the insulating film 28 and the protruding portion 32 can be expanded. Thereby, the on resistance can be reduced.

The recessed portion 42 has a depth D1 in the direction of the depth of the semiconductor substrate 10, and a width W1 in the direction parallel to the front surface of the semiconductor substrate. One end of the recessed portion 42 may be the end portion 38 of the protruding portion 32. Also, the other end of the recessed portion 42 may be a bordering point 44 of a region in which the tilt of the tangential line of the protruding portion 32 relative to the front surface of the semiconductor substrate 10 gradually begins to increase from the side of the end portion 38 toward the tip 34, in the cross section which is perpendicular to the front surface of the semiconductor substrate 10.

The width W1 of the recessed portion 42 may be greater than or equal to a half of the length A of the protruding portion 32. Also, the depth D1 of the recessed portion 42 may be greater than or equal to a half of the depth D2 of the tip 34 of the protruding portion 32. The current path between the insulating film 28 and the protruding portion 32 can be expanded by making the recessed portion 42 large. As one example, the depth D1 of the recessed portion 42 is 0.1 μm or greater and 0.5 μm or less, and the width W1 is 0.1 μm or greater and 0.5 μm or less.

The width W1 and the depth D1 of the recessed portion 42 may be equal. The term, equal, does not mean that they are strictly matched. If the ratio between the width W1 and the depth D1 is approximately 80% or larger and 120% or smaller, the width W1 and the depth D1 are assumed to be equal. With the shape such as this, the shape of the recessed portion 42 is prevented from becoming steep and a local electric field concentration can be prevented.

The recessed portion 42 can be formed in the oxidizing step described in FIG. 3F. As described above, in the body region 12 covered with the gate electrode 30, impurities are not easily absorbed by the insulating film 28, and the position of the end portion 38 of the body region 12 stops at a position opposite the end portion 36 of the gate electrode 30 even though the oxidation progresses. If the oxidation further progresses after the position of the end portion 38 of the body region 12 became the position opposite the end portion 36 of the gate electrode 30, the position of the end portion 38 of the body region 12 hardly moves. However, the impurities near the front surface of the body region 12 which is not covered with the gate electrode 30 are absorbed by the insulating film 28. For this reason, the recessed portion 42 is formed.

Figure 6:
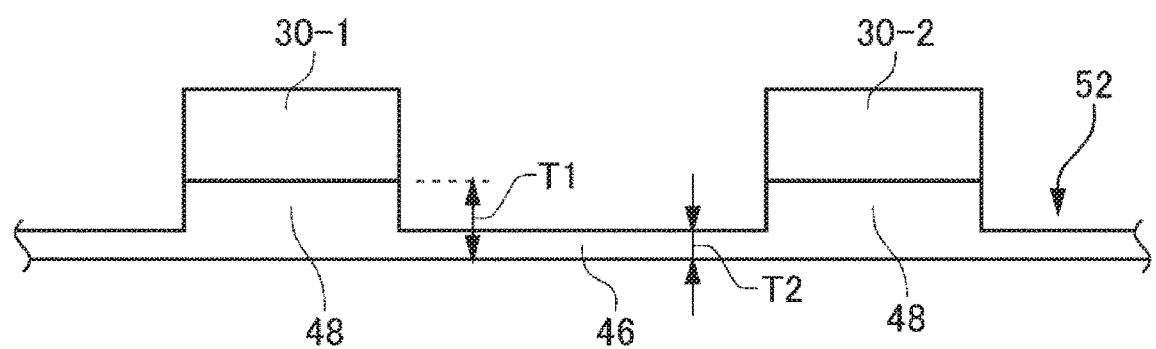
FIG. 6 is a figure showing another example of the step of forming the gate electrode.

FIG. 6 is a figure showing another example of the step of forming the gate electrode described in FIG. 3E. As described above, in the step of forming the gate electrode, the first gate electrode 30-1 and the second gate electrode 30-2 are formed by etching a predetermined pattern on the conductive material 54 formed on the front surface side of the insulating film 52. In the present example, an insulating film 52 in the region 46 on the front surface side of the neck portion 18 is also etched in patterning of the conductive material 54. The etching of the insulating film 52 may be performed continuously with the etching of the conductive material 54 and may be performed separately.

Thereby, a thickness T2 of the insulating film 52 of the region 46 opposite the neck portion 18 becomes smaller than the thickness T1 of the insulating film 52 of the region 48 opposite the gate electrode 30. In this state, the oxidizing step shown in FIG. 3F is performed. By making the insulating film 52 of the region 46 thin, an initial growth rate of the insulating film 52 of the region 46 can be increased in the oxidizing step. For this reason, the impurities can be efficiently pumped out and the protruding portion 32 and the recessed portion 42 can be formed.

Also, by making the insulating film 52 thin, the impurities can be efficiently pumped out even in a process at a lower temperature. For this reason, a generation of a defect in the insulating film 52 can be inhibited, and the TID tolerance can be increased.

The thickness T2 of the insulating film 52 of the region 46 may be less than or equal to a half of the thickness T1 of the insulating film 52 of the region 48. Thereby, the growth rate of the insulating film 52 of the region 46 can be further increased. The thickness T2 may be greater than or equal to a half of the thickness T1.

Figure 7:
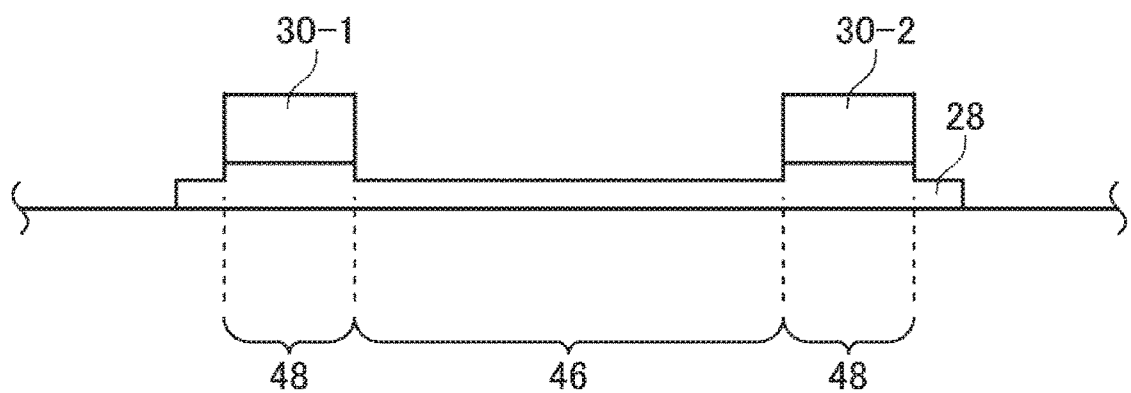
FIG. 7 is a figure showing one example of a shape of an insulating film 28 in a semiconductor device 100.

FIG. 7 is a figure showing one example of the shape of the insulating film 28 in the semiconductor device 100. In the insulating film 28 of the present example, the thickness in the region 46 opposite the neck portion 18 is different from the thickness in the region 48 opposite the gate electrode 30. In the example of the method of manufacturing described above, the semiconductor substrate 10 is further oxidized after forming the gate electrode 30, so the thickness of the insulating film 28 does not necessarily match among the region which is covered with the gate electrode 30 and the region which is not covered with the gate electrode 30.

As shown in FIG. 7, in the insulating film 28, the thickness in the region 46 opposite the neck portion 18 may be less than the thickness in the region 48 opposite the gate electrode 30. As described in FIG. 6, when the insulating film 28 in the region 46 is etched before the oxidizing step, it may have the shape of the insulating film 28 like this.

Also, for the insulating film 28, the thickness in the region 46 opposite the neck portion 18 may be greater than the thickness in the region 48 opposite the gate electrode 30. When the insulating film 28 in the region 46 is not etched before the oxidizing step, it may have the shape of the insulating film 28 like this. Also, even when the insulating film 28 in the region 46 is etched before the oxidizing step, it may have the shape of the insulating film 28 like this by sufficiently increasing the film thickness of the insulating film 28 in the oxidizing step. In this case, the insulating film 28 opposite the neck portion 18 can be made thick, while the insulating film 28 opposite the gate electrode 30 is made thin increasing the TID tolerance.

Figure 8:
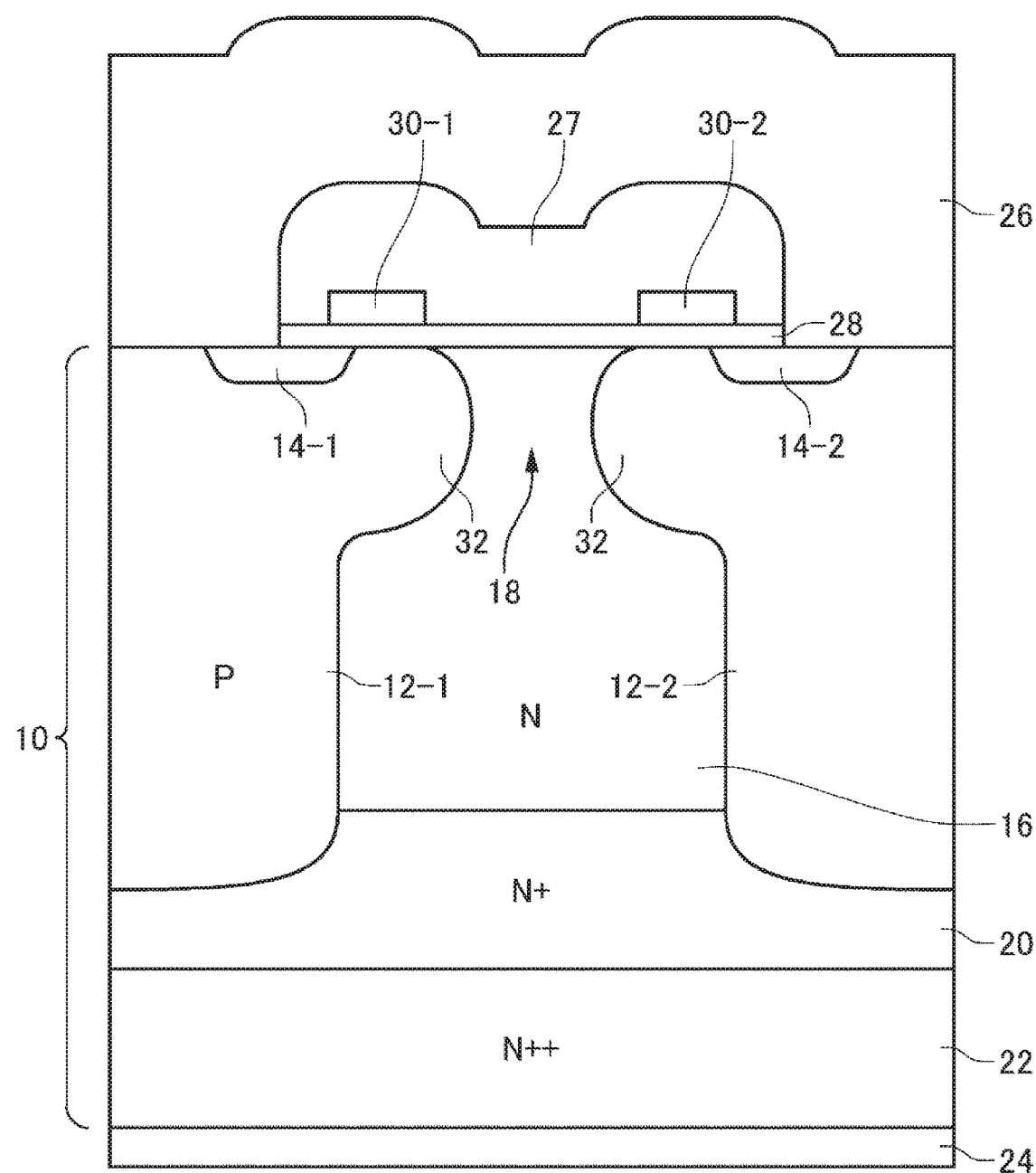
FIG. 8 is a figure showing another configurational example of the semiconductor device 100.

FIG. 8 is a figure showing another configurational example of the semiconductor device 100. In the semiconductor device 100 of the present example, the shape of the body region 12 is different compared to the configuration of the semiconductor device 100 shown in FIG. 1. The other structure may be the same as the semiconductor device 100 shown in FIG. 1.

In the body region 12 of the present example, the end portion of the back surface side reaches the intermediate region 20. That is, a super junction structure is formed by the body region 12 and the drift region 16. Due to the super junction structure, the breakdown voltage of the semiconductor device 100 increases. The structures described in FIG. 1 through FIG. 7 can be applied to the semiconductor device 100 of the super junction structure. The protruding portion 32 is form by protruding in the direction of the neck portion 18 beyond a portion which extends inside the drift region 16 and reaches the intermediate region 20.

Figure 9:
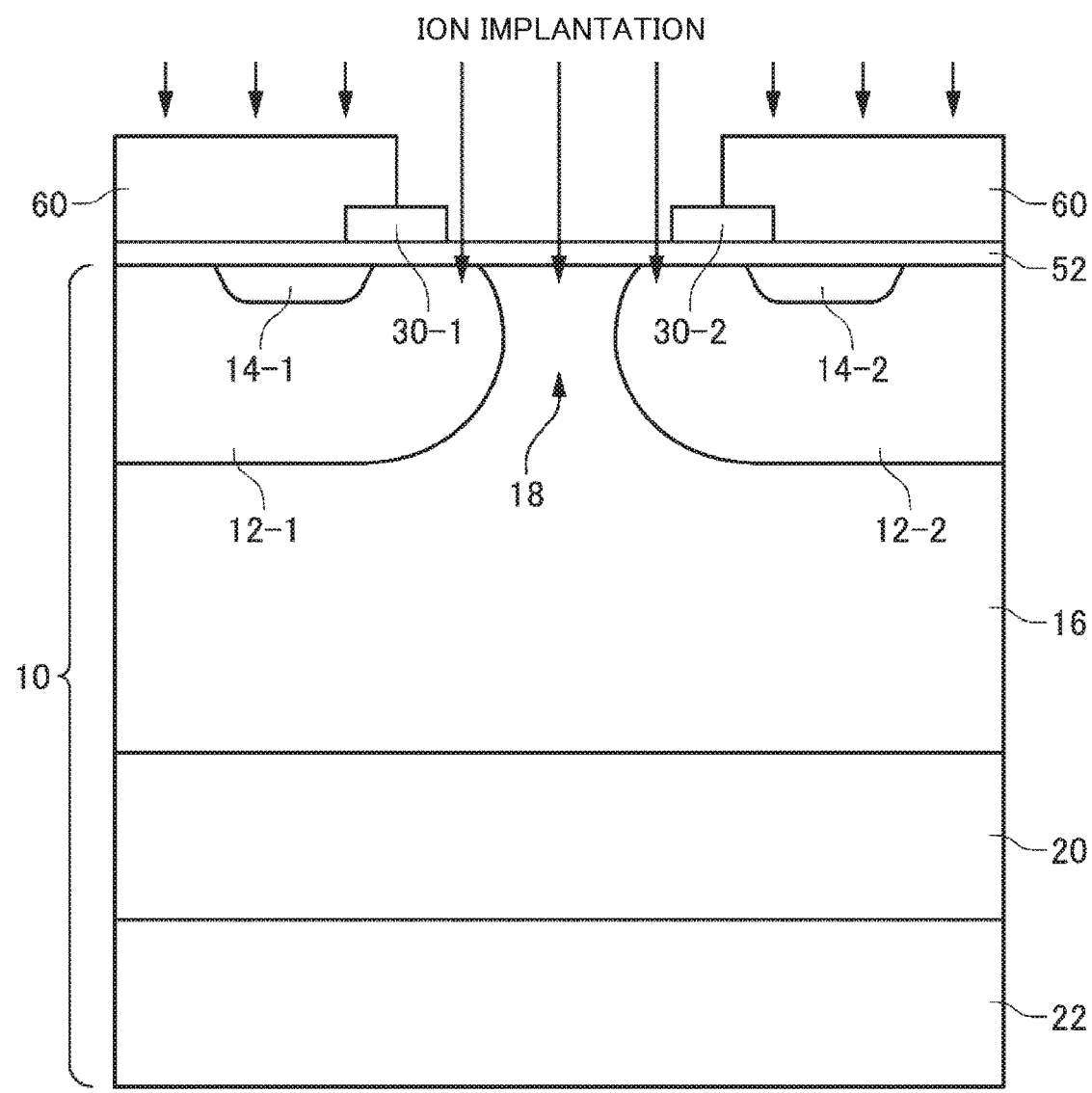
FIG. 9 is a figure showing another example of the step of forming the protruding portion 32.

FIG. 9 is a figure showing another example of the process of forming the protruding portion 32. In the present example, the processes in FIG. 3A through FIG. 3E are the same. The present example has a step of implanting counter impurities instead of the oxidizing process shown in FIG. 3F.

In the step of implanting counter impurities, counter impurities of a first conductivity type are implanted in the neck portion 18, with the first gate electrode 30-1 and the second electrode 30-2 as a mask. The first conductivity type is a conductive type opposite of the conductive type of the body region 12. That is, when n-type impurities are already implanted in the body region 12, the counter impurities are p-type impurities of the body region 12. The counter impurities are implanted with a dose amount which is sufficient to make a portion of the body region 12 the first conductivity type.

As one example, when the semiconductor device 100 is a silicon n-channel MOS transistor, the counter impurities may be arsenic ions or phosphorous ions. As one example, the dose amount of the counter impurities is about $5 \times 10^{13}$/cm$^2$.

Also, when the semiconductor device 100 is a silicon p-channel MOS transistor, the counter impurities may be boron ions. As one example, the dose amount of the counter impurities is about $1 \times 10^{14}$/cm$^2$.

In the step of implanting counter impurities, a resist 60 may be formed on the front surface of the semiconductor substrate 10 before implanting the counter impurities. The resist 60 covers the front surface of the semiconductor substrate 10 other than the neck portion 18. However, a portion of the gate electrode 30 on the side of the neck portion 18 may not be covered with the resist 60. Thereby, even if a positional shift of the resist 60 occurs when forming the resist 60, the resist 60 can be inhibited from covering the neck portion 18.

The process of forming the protruding portion 32 further has an annealing step to anneal the semiconductor substrate 10 after implanting counter impurities in the neck portion 18. Thereby, the counter impurities implanted in the neck portion 18 are activated. By the activated counter impurities, an upper portion of the body region 12 which is not covered with the gate electrode 30 changes to the first conductivity type.

The annealing temperature in the annealing step is lower than the oxidizing temperature in the step of forming the insulating film shown in FIG. 3D, for example, lower than 900 degrees Celsius. The oxidizing temperature in the oxidizing step of the present example is 850 degrees Celsius. In order to activate the counter impurities, a lower limit of the annealing temperature in the annealing step as one example is 700 degrees Celsius. Thereby, the protruding portion 32 can be formed by activating the counter impurities while preventing a degradation of the insulating film 28.

By the process such as this, the protruding portion 32 described in FIG. 1 through FIG. 8 can be formed. The shape of the body region 12 in the present example is similar to that of the body region 12 shown in FIG. 5, for example. However, the end portion 38 of the protruding portion 32 may be provided closer on the side of the source region 14 than the end portion of the gate electrode 30 according to the diffusion length of the counter impurities.

When the semiconductor device 100 is a silicon p-channel MOS transistor, a case where it is difficult to absorb the impurities of the body region 12 in the oxidizing step shown in FIG. 3F can also be assumed. In contrast, according to the method of manufacturing of the present example, the protruding portion 32 can be easily formed in the body region 12 even when the semiconductor device 100 is a silicon p-channel MOS transistor.

While the embodiments of the present invention have been described as above, the technical scope of the present invention is not limited to the scope described in the above-described embodiments. It is apparent to persons skilled in the art that various alterations or improvements can be added to the above-described embodiments. It is also apparent from the description of the scope of claims that the embodiments added with such alterations or improvements can be included in the technical scope of the present invention.

Each process in the method indicated in the scope of claims, specification, and figures may be performed in any order as long as it is not particularly specified using phrases such as "prior to", "before", etc., and also, as long as the output of a previous process is not used in a later process.

EXPLANATION OF REFERENCES

10 . . . semiconductor substrate, 12 . . . body region, 14 . . . source region, 16 . . . drift region, 18 . . . neck portion, 20 . . . intermediate region, 22 . . . drain region, 24 . . . drain electrode, 26 . . . source electrode, 27 . . . interlayer insulating portion, 28 . . . insulating film, 30 . . . gate electrode, 32 . . . protruding portion, 34 . . . tip, 36 . . . end portion, 38 . . . end portion, 40 . . . depletion layer, 42 . . . recessed portion, 44 . . . bordering point, 46 . . . region, 48 . . . region, 50 . . . oxide mask, 52 . . . insulating film, 54 . . . conductive material, 60 . . . resist, 100 . . . semiconductor device

What is claimed is:

1. A semiconductor device comprising:
a semiconductor substrate of a first conductivity type;
a first body region and a second body region having a second conductivity type and provided in a front surface side of the semiconductor substrate;
a neck portion of the first conductivity type provided between the first body region and the second body region;
a first source region having the first conductivity type and formed within the first body region and a second source region having the first conductivity type and formed within the second body region;
a first gate electrode facing the first body region between the first source region and the neck portion and a second gate electrode facing the second body region between the second source region and the neck portion; and
an insulating film continuously provided between the first gate electrode and the semiconductor substrate, between the second gate electrode and the semiconductor substrate, and on a front surface side of the neck portion, wherein
an end portion of the first body region is provided to face an end portion of the first gate electrode, and an end portion of the second body region is provided to face an end portion of the second gate electrode, on a front surface of the semiconductor substrate,
the first body region and the second body region each have a protruding portion which protrudes to the neck portion side beyond an end portion of the body region on the front surface of the semiconductor substrate, and
a tilt of a tangential line of the protruding portion relative to the front surface of the semiconductor substrate gradually increases from a side of the end portion toward a tip of the protruding portion, in a cross section which is perpendicular to the front surface of the semiconductor substrate.

2. The semiconductor device according to claim 1, wherein
a length A with which the protruding portion protrudes to the side of the neck portion beyond the end portion of each body region on the front surface of the semiconductor substrate is in a range of an equation below, $$0 < A < \frac{L}{2} - \sqrt{\frac{2K\varepsilon_0}{q} \frac{N_A}{N_D(N_A + N_D)} \phi_{bi}}$$ [Equation 1]

where L indicates a distance between the first gate electrode and the second gate electrode, K indicates the permittivity of vacuum, $\varepsilon_0$ indicates a relative permittivity of the semiconductor substrate, q indicates the elementary charge, $N_A$ indicates an acceptor concentration of a p-type conductive region of each of the body regions and the neck portion, $N_D$ indicates a donor concentration of an n-type conductive region of each of the body regions and the neck portion, and $\phi_{bi}$ indicates a built-in potential generated in a depletion layer between each of the body regions and the neck portion.

3. The semiconductor device according to claim 1, wherein the protruding portion has a recessed portion of a convex shape on a back surface side of the semiconductor substrate between the front surface of the semiconductor substrate and a tip of the protruding portion which protrudes to the neck portion side the most.

4. The semiconductor device according to claim 3, wherein a depth of the recessed portion in the direction of depth of the semiconductor substrate is equal to a width of the recessed portion in the direction parallel to the front surface of the semiconductor substrate.

5. The semiconductor device according to claim 1, wherein a thickness of at least a portion of the insulating film opposite the neck portion is different from a thickness of the insulating film opposite the first gate electrode and the second gate electrode.

6. A method of manufacturing a semiconductor device comprising:
by implanting impurities of a second conductivity type on a front surface side of a semiconductor substrate of a first conductivity type, forming a first body region and a second body region of the second conductivity type, and a neck portion of the first conductivity type provided between the first body region and the second body region;
forming a first source region of the first conductivity type within the first body region and a second source region of the first conductivity type within the second body region;
forming an insulating film on the front surface of the semiconductor substrate;
forming a first gate electrode opposite the first body region between the first source region and the neck portion and a second gate electrode opposite the second body region between the second source region and the neck portion, on a front surface side of the insulating film;
forming a protruding portion which protrudes to the neck portion side beyond an end portion of each of the first body region and the second body region on the front surface of the semiconductor substrate in first body region and the second body region, after forming the first gate electrode and the second gate electrode.

7. The method of manufacturing according to claim 6, wherein, in the forming of the first gate electrode and the second gate electrode, each of the first and second gate electrodes is formed on an inner side of the body region with respect to the end portion of each of the first and second body regions on the front surface of the semiconductor substrate.

8. The method of manufacturing according to claim 7, wherein the forming of the protruding portion has, oxidizing the front surface of the semiconductor substrate.

9. The method of manufacturing according to claim 8, wherein, in the oxidizing, the insulating film which is not covered with each of the first and second gate electrodes is made to absorb impurities of the first and second body regions which are not covered with each of the first and second gate electrodes.

10. The method of manufacturing according to claim 9, wherein, in the oxidizing, the insulating film is made to absorb the impurities of the first and second body regions until the end portion of the first body region is provided to face the end portion of the first gate electrode, and the end portion of the second body region is provided to face the end portion of the second gate electrode are in opposite positions.

11. The method of manufacturing according to claim 8, wherein an oxidizing temperature in the oxidizing is lower than an oxidizing temperature in the forming of the insulating film.

12. The method of manufacturing according to claim 7, wherein the forming of the protruding portion has implanting counter impurities of a first conductivity type in the neck portion, with the first gate electrode and the second gate electrode being used as a mask.

13. The method of manufacturing according to claim 12, wherein, after the implanting of the counter impurities, the forming of the protruding portion further has annealing the semiconductor substrate with a temperature lower than an oxidizing temperature in the forming of the insulating film.

14. The method of manufacturing according to claim 6, wherein, in the forming of the insulating film, the insulating film is formed by oxidizing the front surface of the semiconductor substrate.

15. The method of manufacturing according to claim 6, wherein, in the forming of the first gate electrode and the second gate electrode, a conductive film is formed on the front surface side of the insulating film, the first gate electrode and the second gate electrode are formed by patterning the conductive film, and the insulating film on the front surface side of the neck portion is etched in the patterning.

* * * * *